United States Patent [19]
Scifres et al.

[11] Patent Number: 4,688,884
[45] Date of Patent: Aug. 25, 1987

[54] FIBEROPTIC COUPLING SYSTEM FOR PHASED-ARRAY SEMICONDUCTOR LASERS

[75] Inventors: Donald R. Scifres; D. Philip Worland, both of San Jose, Calif.

[73] Assignee: Spectra Diode Laboratories, Inc., San Jose, Calif.

[21] Appl. No.: 796,901

[22] Filed: Nov. 12, 1985

[51] Int. Cl.$^4$ .............................................. G02B 6/26
[52] U.S. Cl. ............................. 350/96.15; 350/96.30
[58] Field of Search ............... 350/96.15, 96.16, 96.18, 350/96.20, 96.29, 96.30; 250/227; 357/17, 30; 372/18

[56] References Cited

U.S. PATENT DOCUMENTS

| | | | |
|---|---|---|---|
| 3,910,677 | 10/1975 | Becker et al. | 350/96 |
| 4,143,940 | 3/1979 | Khoe | 350/96.15 |
| 4,327,963 | 5/1982 | Khoe et al. | 350/96.18 |
| 4,370,021 | 1/1983 | Khoe et al. | 350/96.18 |
| 4,398,790 | 8/1983 | Righini et al. | 350/96.18 |
| 4,415,227 | 11/1983 | Unger | 350/96.15 |
| 4,440,470 | 4/1984 | Khoe | 350/96.20 |
| 4,456,330 | 6/1984 | Blüdau | 350 96.18/ |
| 4,490,020 | 12/1984 | Sakaguchi et al. | 350/96.18 |
| 4,521,070 | 6/1985 | Sottini et al. | 350/96.15 |
| 4,641,311 | 2/1987 | Ackley | 372/18 |

OTHER PUBLICATIONS

Cheng et al., Applied Optics, 21(19), Oct. 1, 1982, "Highly Efficient Power coupling Between GaAlAs Lasers and Tapered-Hemispherical-End-Multimode Fibers," pp. 3409–3410.
Sunak et al., Applied Optics, 22(15), Aug. 1, 1983, "Launching Light from Semiconductor Lasers into Multimode fibers . . .," pp. 2344–2348.
Maeda et al., IEEE Transactions on Comm., vol. COM-26, No. 7, Jul. 1978, Buried-Heterostructure Laser Packaging for Wideband . . . ," pp. 1076–1081.
D. R. Scifres et al., Appl. Phys. Let., vol. 41, No. 2, pp. 118–120, 1982, Spectra Diode Labs, "50mW cw GaAlAs Laser Diode Fiber Coupled Package, Model SDL-2410-H2".

*Primary Examiner*—William L. Sikes
*Assistant Examiner*—Frank González

[57] ABSTRACT

A fiberoptic coupling system comprising a phased array semiconductor laser and a squashed multimode light transmitting fiber. The squashed input end has an oblong, preferably elliptical, or polygonal cross-section with major and minor core widths. The major width decreases toward an output end which preferably has a circular cross-section. The minor width may increase toward the output end or remain constant. This increase and decrease correspond to the characteristic laser light beam widths and divergences in planes parallel and perpendicular to an active region of the laser such that the fiber core widths are at least as large as the laser light beam widths and the fiber has input numerical apertures that cause the beam to be coupled at the divergences. This system has a light coupling efficiency of at least 70 percent.

16 Claims, 8 Drawing Figures

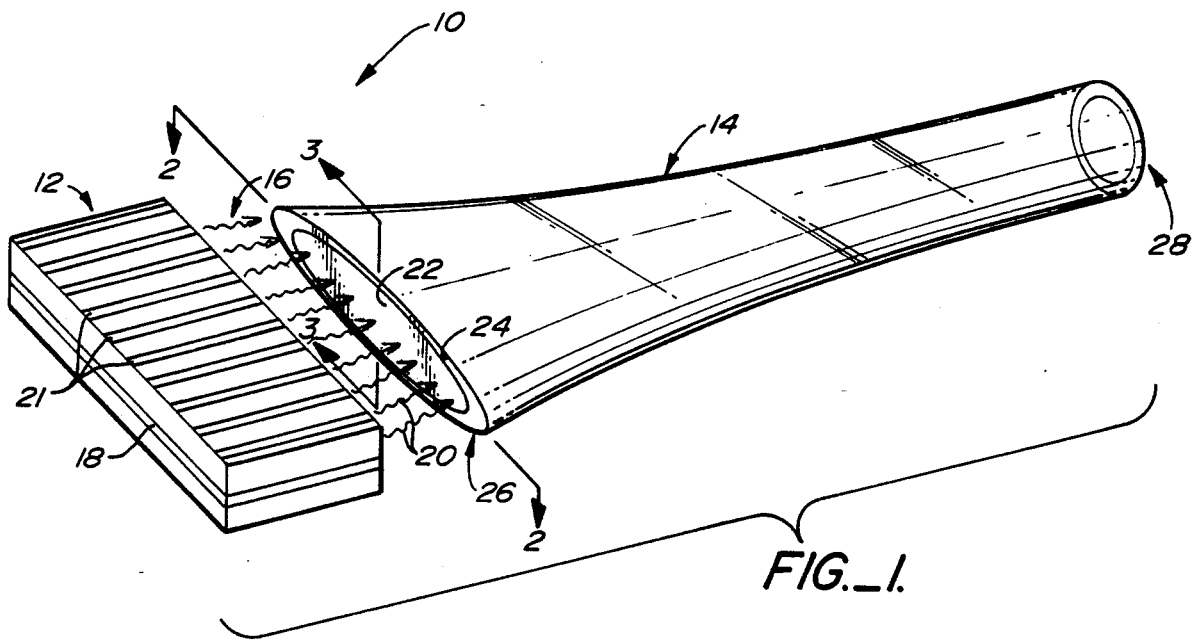
FIG._1.
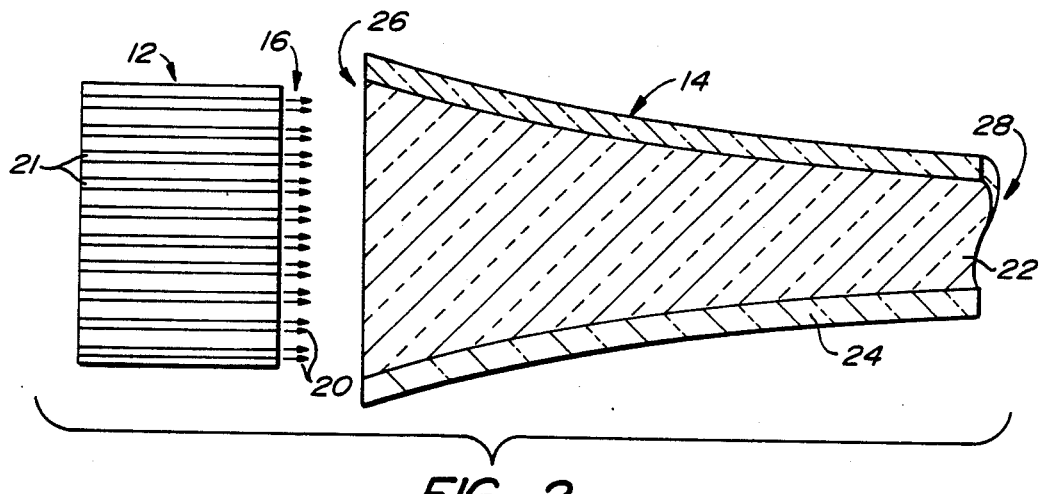
FIG._2.
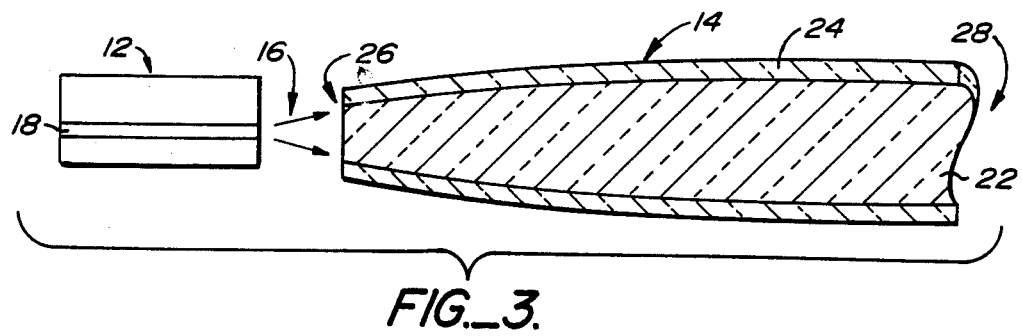
FIG._3.

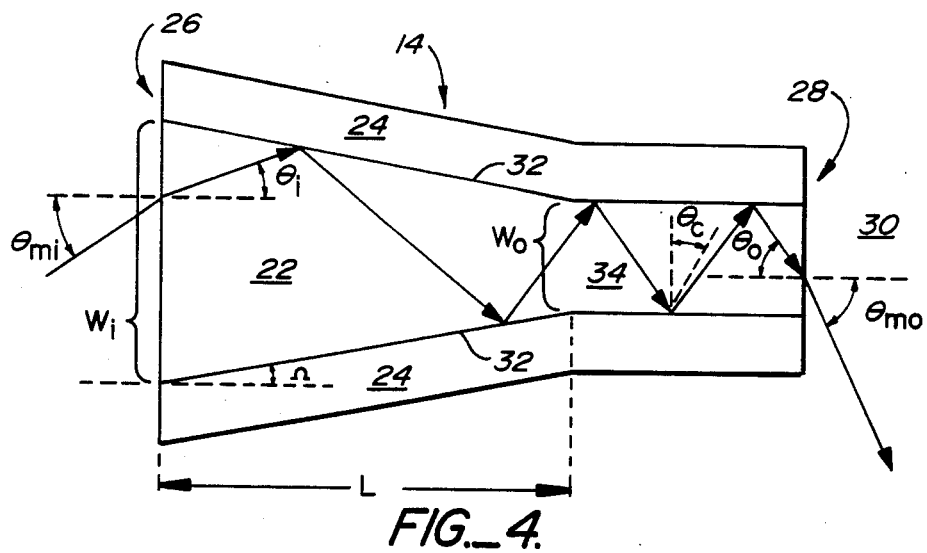
FIG._4.
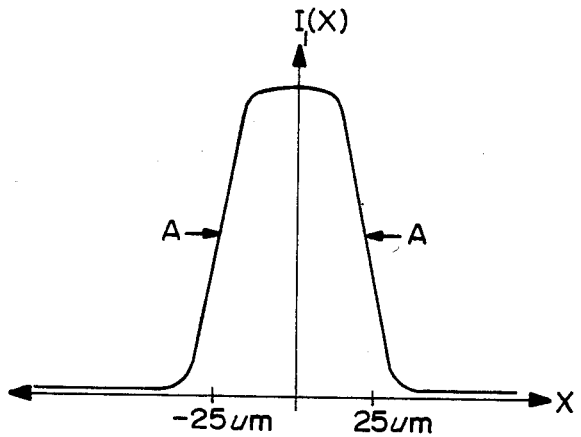
FIG._5a.
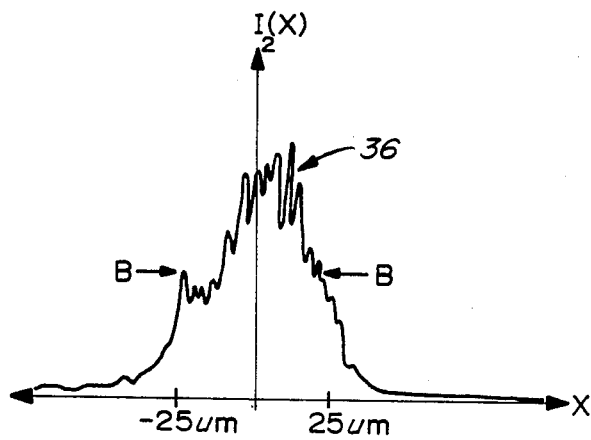
FIG._5b.
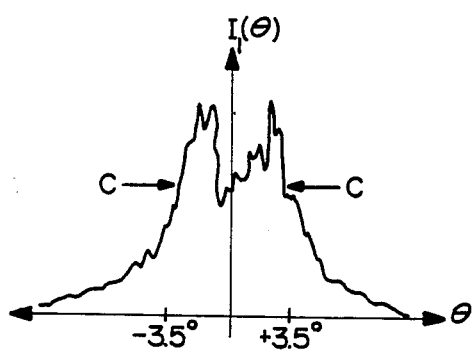
FIG._5c.
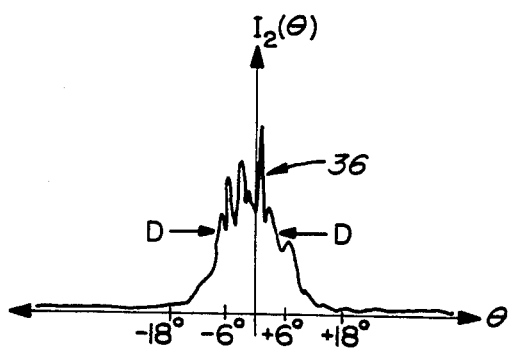
FIG._5d.

FIBEROPTIC COUPLING SYSTEM FOR PHASED-ARRAY SEMICONDUCTOR LASERS

TECHNICAL FIELD

The present invention relates to optical coupling of light transmitting fibers to a light source, and in particular to coupling systems for coupling light between a semiconductor laser array and a multimode fiber.

BACKGROUND ART

In U.S. Pat. No. 4,143,940 to Khoe a device for coupling a laser radiation source to a monomode optical transmission fiber is disclosed in which the end of fiber's core is covered with a reflecting layer adjoining one cleaved mirror end of the laser. The core's reflecting layer causes a local increase in the reflectivity which causes only the lowest order transversal mode to be stimulated. A high coupling efficiency is achieved which may be increased further by slightly flattening the fiber end so that it has an elliptical cross-section, and by disposing a semi-ellipsoid lens on the end of the fiber core. Care must be taken that the major axis of the ellipse remains smaller than the width of the effective active layer of the laser so that the modeselective effect of the core's reflecting layer is not lost. The lens has a correcting effect on the asymmetrical divergence of the laser beam. This lens is made as a unitary mass with the fiber core in U.S. Pat. No. 4,370,021 to Khoe et al.

For many applications, such as laser surgery, it is desirable to obtain not only the highest possible optical power level, but also a high power density in a small core diameter multimode fiber. Due to effects of divergence of laser light and the mismatch of the guided modes in a rectangular optical waveguide of a diode laser array with those in a cylindrical optical fiber, the coupling efficiency is low. Previously, 140 milliwatts of continuous wave optical power was reported to be transmitted through a 100 micrometer core, 0.3 numerical aperture (N.A.) optical fiber using a laser diode array. The laser array had a lateral dimension of 100 micrometers with a lateral beam divergence of five degrees measured at full-width-half-maximum (FWHM). The beam had a vertical dimension of one micrometer with a 30 degrees FWHM divergence. These characteristics are typical of laser arrays. The coupling efficiency with that fiber was approximately 50 percent.

It would be desirable, however, to couple the same amount of total power into a smaller core diameter optical fiber. This would lead to a higher power density. However, if one simply butt couples the 100 micrometer wide laser array described above to a 50 micrometer core diameter fiber, then much of the laser light would not be guided into the fiber. That is, the coupling efficiency would be quite low.

It is an object of the invention to couple high densities of optical power efficiently between a diode laser array and a small core diameter optical fiber.

DISCLOSURE OF THE INVENTION

The above object has been met with a fiberoptic coupling system that couples at least seventy percent of the laser light from a phased array semiconductor laser into a multimode light transmitting fiber with an output end circular core diameter smaller than the maximum light emitting width of the laser source. This is achieved by using a fiber which has been squashed, typically into an elliptical shape, at an input end. The resulting fiber is characterized by a major core width in a plane parallel to an active region of the laser, and a minor core width in a plane perpendicular to the active region. The laser emits light as an array, preferably phase-locked, of individual optically coupled light elements. The array of light is characterized by a width and divergence in each of the planes parallel and perpendicular to the active region. The major core diameter at the input end of the fiber is at least as large as the lateral array width parallel to the active region, and tapers or decreases monotonically from the input end to an output end. What is meant by the term monotonically is that the core diameter changes in a manner that is smooth, continuous, and gradual, either increasing or decreasing. Abrupt or discontinuous changes in core diameter that cause disruption of light propagation are avoided. An important aspect of the present invention is that the amount of taper or decrease in the major core diameter corresponds inversely to the lateral light divergence in a composite beam formed of individual sources parallel to the active region in such a way that a large percentage of laser light in the beam is coupled into and guided by the fiber core. In general, the amount of taper depends on both the divergence of the laser beam and an intrinsic numerical aperture of the fiber. Numerical aperture is a measure of the maximum angle at which light can be coupled into or out of an optical fiber while remaining guided by the core of the fiber. Similarly, the minor core diameter may increase monotonically from the input end to the output end of the fiber to correspond to the generally larger transverse divergence perpendicular to the active region. Input numerical aperture may be used to express these core diameter changes. A fiber has, in a particular plane, an increase or decrease in a core diameter that corresponds with a laser light beam divergence when its input numerical aperture is such as to accept a laser light beam with that divergence, thereby efficiently coupling the beam into the fiber.

Broad area lasers, i.e. semiconductor laser devices which emit extended light beams over a width of greater than about 15 micrometers, may also be used, instead of phased-array lasers, with flat fibers, i.e. fibers with polygonal cross-section, in which the lateral core dimension of the fiber tapers from a large input to a smaller output. The transverse core dimension in the plane perpendicular to the laser's active region remains constant from the fiber input to the fiber output. The fiber has a large input area and a smaller output area.

Thus by using squashed fibers, which more closely conform to the shape of the emitted laser light, and create the appropriate diameter changes, higher densities of optical power are efficiently coupled into the fibers. Further, the changes in major and minor core diameters between the input and output end of a fiber is made to correspond to the lateral and transverse divergences of a laser beam from a semiconductor laser array in the planes parallel and perpendicular to the active region of the laser, so as to achieve more efficient coupling and brighter sources. This fiberoptic coupling system may thus be used for such high power applications as laser surgery, star coupled local area networks, pyrotechnic ignition, remote optical powering of sensors, and fiber addressed liquid crystal displays.

BRIEF DESCRIPTION OF THE DRAWINGS

FIG. 1 is a perspective view of the fiberoptic coupling system of the present invention.

FIG. 2 is a sectional view taken along the lines 2—2 in FIG. 1.

FIG. 3 is a sectional view taken along the lines 3—3 in FIG. 1.

FIG. 4 is a schematic of the system of FIG. 2 for describing operation of the invention.

FIGS. 5a and 5b are graphs of near field intensity versus lateral distance for the systems of the prior art and the present invention.

FIGS. 5c and 5d are graphs of far field intensity versus lateral angle for phased array lasers and the system of the present invention.

BEST MODE OF CARRYING OUT THE INVENTION

With reference to FIG. 1, a fiberoptic coupling system 10 comprises a semiconductor laser array 12 and a light transmitting fiber 14. Laser 12 emits a light beam 16 from an active region 18 of the laser. Laser light beam 16 comprises an array of light source elements 20, preferably in a phase-locked relation to one another, which couple into fiber 14.

Laser 12 is typically a multiple stripe laser having a plurality of current confining stripes 21 providing paths for pumping current to active region 18. Laser 12 is typically constructed as a GaAs/GaAlAs heterostructure laser, but other materials and constructions known in the art may also be used. Laser 12 may have light guiding structures therein, and may also be a quantum well or multiple quantum well laser. In any case, laser 12 emits light beam 16 in an array of light elements 20. The number of elements 20 varies, there being typically from ten to forty such light elements. A ten element laser array is shown in FIG. 1, but the number of elements is not critical. Broad area lasers, that is those lasers with emitting widths greater than 15 micrometers may also be used, particularly with some of the fibers having a taper in only one dimension described herebelow.

Fiber 14 comprises a core 22 of transparent material of one index of refraction surrounded by a cladding 24 of material of a lower index of refraction. Preferably, core 22 is made from fused silica or glass. Cladding 24 may be made from fused silica, glass, or plastic. Typically, fiber 14 is a multimode step index fiber. Graded index fibers may also be used. The core index of refraction typically ranges from 1.45 to 1.55 and is from one to five percent greater than the cladding index of refraction. Fiber 14 has an input end 26, into which laser light 16 is coupled, and an output end 28. Fiber 14 typically has a circular cross-section at output end 28, but is squashed at input end 26, so that input end 26 is oblong, typically having an elliptical cross-section. Fibers may also be flat, with polygonal cross-section, for example rectangular or hexagonal in shape for easy stacking.

Fiber 14 is made by taking an ordinary multimode step index optical fiber, known in the art, and placing a very large diameter glass rod around the fiber. Fiber 14 typically has a core diameter of 50 micrometers, while the glass rod has a typical diameter of about 3 millimeters. This outer glass rod is then squashed between two heated parallel planar surfaces. This causes fiber 14 to be gradually tapered from an oblong input end 26 to a circular output end without abrupt or discontinuous changes in core diameters. The fiber is then cleaved or broken and polished flat at the end. Fiber 14 may also be drawn as it is squashed to produce fibers which are tapered in one direction, typically the lateral direction, but with a uniform dimension in another direction. Drawn flat fibers may then have a large area rectangular input end which tapers to a smaller area square or rectangular output end.

The light beam 16 is characterized by a lateral first width and a lateral first divergence in a plane parallel to active region 18, and a transverse second width and a transverse second divergence in a plane perpendicular to active region 18. Fiber 14 is in turn characterized by a major core diameter in a plane parallel to active region 18 and a minor core diameter in a plane perpendicular to active region. Fiberoptic coupling system 10 will now be discussed in more detail in FIG. 2, showing the system 10 in the plane parallel to active region 18, and FIG. 3, showing the system 10 in the plane perpendicular to active region 18.

In FIG. 2, laser 12 emits a laser light beam 16 formed from light elements 20. Array 16 is typically made up of from ten to forty light elements 20 with a total lateral width of from 100 micrometers to 400 micrometers. The lateral divergence of the beam is typically between 5 degrees and 7 degrees measured at full-width-half-maximum (FWHM) for 100 micrometer wide beam 16. This divergence is true if the laser operates in any of its allowed modes. Best results in terms of reducing the fiber diameter will be obtained when a phase locked laser array operates in its lowest divergence supermode.

Fiber 14 is made to correspond with beam 16, as will be explained in more detail below, with respect to both lateral width and lateral divergence. Core 22 has a major core diameter, which at input end 26 is at least as large as the lateral width of beam 16. For 100 micrometer wide beams 16, the major core diameter typically ranges from 100 micrometers to 170 micrometers. The major core diameter of core 22 tapers or monotonically decreases without abrupt or discontinuous changes to output end 28 so as to cause fiber 14 to admit a beam 16 of its lateral divergence with efficient coupling. The core diameter at the output end is typically about 50 micrometers efor 100 micrometer wide beams 16. The core diameter at the output end is usually larger than 50 micrometers for arrays 16 larger than 100 micrometers but is still less than the lateral width of beam 16. The rate of taper is small, the decrease in major core diameter typically occuring over a length of one millimeter to several centimeters.

In FIG. 3, laser 12 emits a light beam 16 from plural elements having a beam thickness or transverse width on the order of one micrometer. The transverse width corresponds generally to the thickness of active region 18, but may also be affected by light guiding layers, not shown, which are adjacent to active region 18. Because the transverse width is small, transverse divergence is quite large, typically being between 20 degrees and 60 degrees FWHM.

Fiber 14 is preferably made to correspond with beam 16, as will be explained in more detail be.ow, with respect to transverse width and transverse divergence. Core 22 has a minor core diameter, which at input end 26 is typically between ten micrometers and 30 micrometers. The minor core diameter increases monotonically without abrupt or discontinuous changes over a length of several millimeters to output end 28, where it is typically about 50 micrometers.

With reference to FIG. 4, fiber 14 has a core 22 with an index of refraction $n_1$ and a cladding 24 with an index of refraction $n_2$. Fiber 14 also has a larger major core diameter $W_i$ at input end 26 than the core diameter $W_o$ at output end 28. Beam 16, propagating through air 30, enters fiber 14 from its input end with an incident angle $\theta_{mi}$, and begins propagating through the fiber at an angle $\theta_i$ relative to the center of core 22. As the beam 16 propagates it is guided by total internal reflection at the core/cladding interface 32. Since the fiber 14 is tapered, the angle of propagation becomes more sharp. Finally, beam 16 emerges from the smaller end 34 with an angle $\theta_o$ larger than $\theta_i$ and is emitted by fiber 14 at its output end 28 at an angle $\theta_{mo}$.

Numerical aperture (NA) is a measure of the maximum angle at which an optical fiber will emit or accept light. The output numerical aperture $NA_{out}$ is $$NA_{out} = \sin\theta_{mo(max)} = n_1 \sin\theta_{o(max)}, \quad (1)$$

where $\theta_{mo(max)}$ is the maximum angle of emitted light, and $\theta_{o(max)}$ is the maximum propagation angle in the fiber. For light 16 to be guided, $\theta_o$ must be total internally reflected at core cladding interface 32. This is expressed by the equation $$\sin\theta_c = N_2/N_1, \quad (1)$$

where $\theta_c$ is the critical angle for total internal reflection. Thus, from (1) and (2):

$$NA_{out} = n_1 \cos\theta_c = \sqrt{n_1^2 - n_2^2} \quad (3)$$

This value is intrinsic to the fiber indices of refraction and will be referred to as the intrinsic numerical aperture of the fiber (NA).

Fiber 14 is tapered at an angle $$\Omega = \arctan(W_i - W_o)/2L$$

where L is the length over which taper or decreasing major core diameter occurs. In the present invention, since the decrease in major core diameter occurs over a length L which is large, typically several millimeters, the taper angle $\Omega$ is close to zero. The relationship between input and output angles of propagation $\theta_i$ and $\theta_o$ is $$W_o \sin\theta_o = W_i \sin\theta_i \quad (4) \text{ for small taper angles } \Omega.$$

The input numerical aperture $NA_{in}$ is thus easily obtained.

$$NA_{in} = \sin\theta_{mi(max)} = n_1 \sin\theta_{i(max)} \quad (5)$$

where $\theta_{mi(max)}$ is the maximum angle of light accepted by fiber 14, and $\theta_{i(max)}$ is the initial propagation angle of this accepted light. From equations (4) and (1), we obtain the result $$NA_{in} = n_1(W_o/W_i)\sin\theta_{o(max)} = (W_o/W_i) NA \quad (6)$$

Hence, since $W_o < W_i$, decreasing major core diameter or taper collects light most efficiently from a light source 12 with a large lateral width, and a small lateral divergence. For example, if a laser has a lateral width which is two times larger than the output core diameter of the fiber, then the emission angle of the lateral laser source must be about half that of the intrinsic acceptance angle of the fiber, as defined by the intrinsic numerical aperture NA.

The increasing minor core diameter from input end 26 to output end 28 causes propagating light 16 to become less steep. The effect is the reverse of the tapered major core diameter. Light 16 is collected most efficiently, in this case, for a large transverse beam divergence and small transverse width. So, for a small input end fiber dimension which continuously tapers to an output end with a dimension twice that of the input end dimension, the effective acceptance angle of the laser light is approximately doubled relative to the fiber's intrinsic acceptance angle. This aids coupling of the semiconductor laser output in the transverse plane perpendicular to the laser's active region, since typically a laser emits light with a large divergence in the plane, which is not totally collected by conventional multimode fibers.

The above described effects of decreasing the major core diameter and increasing the minor core diameter from the input end 26 to the output end 28 determine the amount of fiber squashing that is acceptable. A tradeoff is made between the divergence of the beam and the core diameter of the fiber. The increase or decrease in the lateral or transverse core diameters of the fiber correspond to the beam's lateral or transverse divergences, respectively, such that the resulting lateral or transverse input numerical apertures are at least large enough to accept light from the beam at those divergences, thereby efficiently coupling the beam into the fiber. Lower beam divergences permit greater dimensional change of the fiber. For a given array laser 12 with lateral width, $B_1$, lateral divergence FWHM, $2 \cdot \theta_1$, transverse width, $B_2$, and transverse divergence FWHM, $2 \cdot \theta_2$, the desired major and minor core diameters at the input end, $W_i$ and $V_i$ respectively, are determinable from the circular core diameter $W_o$ and numerical aperture NA of a pre-squashed fiber:

$$B_1 \text{ and } W_o \cdot NA \leq W_i \leq W_o \cdot NA/\sin\theta_1, \quad (7)$$
and $$B_2 \text{ and } W_o \cdot NA \leq V_i \leq W_o \cdot NA/\sin\theta_2, \quad (8)$$
and $$W_i V_i \approx W_o^2. \quad (9)$$

Equations (7) and (8) result from requiring that the lateral and transverse input numerical apertures $NA_{in}$ be such as to accept light at the lateral and transverse divergence angles respectively, and by requiring that the major and minor core diameters be at least as large as the lateral and transverse widths of the laser light respectively. Thus, the fiber dimensions and taper correspond to the laser beam's characteristics so as to efficiently couple the light beam into the fiber. Equation (9) results from the assumption that squashing a fiber end 26 has little effect on the cross-sectional area of core 22. Squashing a fiber end 26 produces a slight decrease in the core's cross-sectional area but this is negligible for all but the most extreme amounts of squashing.

For fibers which taper in only one of two orthogonal directions, such as those produced by both squashing and drawing, one of the equations (7) and (8) applies to the core width which changes or tapers from the input end to output end of the fiber. If the lateral core width tapers then equation (7) applies. If the transverse core width tapers then equation (8) applies. Equation (9)

does not apply. For example, a flat fiber with a rectangular input end which tapers in one dimension to a square or rectangular output end has a significantly larger cross sectional area at one end, typically the input end, than the other end. Such fibers can have a greater amount of taper and can be coupled to large area lasers with extended sources. Example:

A phased array semiconductor laser has a lateral width $B_1 = 100$ micrometers, a transverse width $B_2 = 1$ micrometer, a lateral divergence $2\cdot\theta_1 = 5°$, and a transverse divergence $2\cdot\theta_2 = 30°$. A presquashed fiber has a core diameter $W_o = 50$ micrometers and an intrinsic numerical aperture $NA = 0.3$.

From equation (7), $100 \ \mu m \leq W_i \leq 344 \ \mu m$ From equation (8), $15 \ \mu m \leq V_i \leq 58 \ \mu m$ From equation (9), $W_o^2 = 2500 \ \mu m^2 = V_i \cdot W_i$ so, major core diameter at input end $26 \ W_i$ is between 100 micrometers and 167 micrometers, and the minor core diameter at input end $26 \ V_i$ is between 15 micrometers and 25 micrometers. Fiberoptic coupling systems made according to this example couple continuous wave laser light with approximately 80 percent efficiency and emit 850 milliwatts cw from the fiber's output end. The system can also couple a train of 200 nanosecond long pulses at a 10 kHz repetition rate with a coupling efficiency of 77 percent. Peak output power from this pulsed laser coupled fiber is 2.8 watts. Thus, the elliptically shaped continuously tapered fiber acts to provide higher coupling efficiency and higher brightness outputs.

With reference to FIG. 5a, a standard unsquashed 50 micrometer, 0.3 NA fiber coupled to a semiconductor laser with a single light element emits light having a single lobed intensity distribution $I_1(X)$. The lateral width in a plane X parallel to the active region is 50 micrometers FWHM, as indicated by the arrows A—A.

In FIG. 5b, a squashed fiber with a core diameter of 50 micrometers at the output end couples to a phased array semiconductor laser with a 100 micrometer first width. The light propagating in the fiber is guided by its 50 micrometer core as depicted by the near field intensity distribution $I_2(X)$ at the fiber output end. The lateral width is 50 micrometers at the full-width-half-maximum points, indicated by arrows B—B.

In FIG. 5c, the far field intensity distribution $I_1(\theta)$ of a phased array semiconductor laser is bilobed. Although some phased array semiconductor lasers can be made to emit light in a single lobed far field pattern, the bilobed intensity distribution $I_1(\theta)$ is characteristic of most array lasers. At the full-width-half-maximum points, arrows C—C, the lateral divergence is approximately seven degrees.

In FIG. 5d, the far field intensity distribution $I_2(\theta)$ of the output of the fiberoptics coupling system of the present invention is single lobed regardless of the far field pattern of the laser array coupling to the fiber in the system. The FWHM divergence, indicated by arrows D—D, is 12 degrees. Virtually all the fiberoptics output power is contained within a 36 degree core angle corresponding to a 0.3 numerical aperture.

In FIGS. 5b and 5d, a speckle pattern 3o due to the coherence of semiconductor laser emission in the multimode fiber is observed in both the near field and far field. This speckle is substantially reduced relative to that obtained from a single mode semiconductor laser because of a broad spectral bandwidth, typically about 20 Angstroms, of a laser array.

The system of the present invention may be used in laser surgery, star coupled local area networks, pyrotechnic ignition, remote optical powering of sensors, and fiber addressed liquid crystal display, due to the systems high coupling efficiency and favorable light output characteristics.

We claim:

1. A fiberoptic coupling system comprising,
   a semiconductor laser array emitting a composite laser beam formed from a plurality of light sources having characteristic lateral and transverse divergences and characteristic lateral and transverse widths, and
   a squashed multimode light transmitting fiber, said laser beam coupling into said fiber at a squashed input end with an oblong cross-section, said oblong cross-section defining characteristic major and minor core diameters, said major core diameter being at least as large as said lateral width, said fiber having at the squashed input end lateral and transverse numerical apertures, the lateral numerical aperture being such as to cause the multimode fiber to accept said beam at said lateral divergence.

2. The system of claim 1 wherein said minor core diameter is at least as large as said transverse width, said transverse numerical aperture being such as to cause the fiber to accept the beam at said transverse divergence.

3. The system of claim 1 wherein said squashed input end has an elliptical cross-section.

4. The system of claim 1 wherein at least 70 percent of said laser beam is coupled into said fiber.

5. A fiberoptic coupling system comprising,
   a phased array laser emitting laser light in a beam from an active region of said laser having a phase-locked array of light source elements forming the beam, said array having a lateral width and a lateral divergence in a plane parallel to said active region and a transverse width and a transverse divergence in a plane perpendicular to said active region, and
   a light transmitting fiber having an input end and an output end, said laser beam coupling to said fiber at said input end, said fiber having a major core width and minor core width in planes respectively parallel and perpendicular to said active region of said laser, the major core width being at least as large as said lateral width at said input end, said major core width decreasing monotonically from said input end to said output end by an amount corresponding to said lateral divergence such that the light of said laser beam is efficiently coupled into said fiber.

6. The system of claim 5 wherein said minor core width increases monotonically from said input end to said output end by an amount corresponding to said transverse divergence such that a maximum amount of said laser light is coupled into said fiber.

7. The system of claim 5 wherein said output end of said fiber has a circular cross-section.

8. The system of claim 5 wherein said input end of said fiber has an elliptical cross-section.

9. The system of claim 5 wherein at least 70% of said laser light is coupled into said fiber.

10. The system of claim 5 wherein the major core width at said input end, $W_i$, satisfies the equation $$W_i \leq W_o \cdot NA / \sin \theta_1$$

where $W_o$ is the major core width at said output end, the fiber has an intrinsic numerical aperture, NA, and $\theta_1$ is one-half of the lateral divergence, said lateral divergence being measured at full-width-half-maximum points of the laser beam.

11. The system of claim 6 wherein the minor core width at said input end, $V_i$, satisfies the equation $$V_i \leq V_o \cdot NA / \sin \theta_2$$

where is the minor core width at said output end, the fiber has an intrinsic numerical aperture, NA, and $\theta_2$ is one-half of the transverse divergence, said transverse divergence being measured at full-width-half-maximum points of the laser beam.

12. The system of claim 5 wherein said lateral width is approximately 100 micrometers, said lateral divergence is approximately 5 degrees full-width-half-maximum, said transverse width is on the order of 1 micrometer, said transverse divergence is approximately 30 degrees full-width-half-maximum, and wherein said fiber has an intrinsic numerical aperture of 0.3 and an output end with a 50 micrometer diameter circular cross-section, said major core width at the input end being between 100 micrometers and 167 micrometers, said minor core width at the input end being between 15 micrometers and 25 micrometers.

13. A fiberoptic coupling system comprising,
a laser emitting laser light in a beam from an active region of said laser, said beam having a lateral width of at least 15 micrometers and a lateral divergence in a plane parallel to said active region and a transverse width of at most one micrometer and a transverse divergence in a plane perpendicular to said active region, and
a light transmitting fiber having an input end and an output end, said fiber having a major core width and a minor core width in planes respectively parallel and perpendicular to said active region of said laser, said major and minor core widths of said input end being at least as large respectively as said lateral and transverse widths of said beam, one of said major and minor core widths changing from said input end to said output end by an amount corresponding to said transverse and lateral divergences such that light of said laser beam is efficiently coupled at said input end into said fiber.

14. The system of claim 13 wherein the other of said major and minor core widths is constant from said input end to said output end.

15. The system of claim 13 wherein said fiber has a polygonal cross-section.

16. The system of claim 13 wherein said fiber has transverse and lateral input numerical apertures at least large enough as to cause said fiber to accept said beam with said transverse and lateral divergences.

* * * * *

UNITED STATES PATENT AND TRADEMARK OFFICE
CERTIFICATE OF CORRECTION

PATENT NO. : 4,688,884
DATED : August 25, 1987
INVENTOR(S) : Donald R. Scifres et al.

It is certified that error appears in the above—identified patent and that said Letters Patent is hereby corrected as shown below:

Column 4, line 44, "efor 100 micrometer wide beams 16" should read --for 100 micrometer wide beams 16--.

Column 5, line 53, "$NA_{in=sin\theta mi(max)} = n_1 Sin\theta_{i(max)}$  (5)" should read --$NA_{in} = Sin\theta_{mi(max)} = n_1 Sin\theta_{i(max)}$  (5)--.

Claim 11, column 9, line 8, "where is the minor core width" should read --where $V_o$ is the minor core width--.

Signed and Sealed this

Ninth Day of February, 1988

Attest:

DONALD J. QUIGG

Attesting Officer

Commissioner of Patents and Trademarks